(12) United States Patent
Bellini et al.

(10) Patent No.: US 10,170,557 B2
(45) Date of Patent: Jan. 1, 2019

(54) THYRISTOR WITH IMPROVED PLASMA SPREADING

(71) Applicant: ABB Schweiz AG, Baden (CH)

(72) Inventors: Marco Bellini, Schlieren (CH); Jan Vobecky, Lenzburg (CH); Paul Commin, Zürich (CH)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 15/826,427

(22) Filed: Nov. 29, 2017

(65) Prior Publication Data

US 2018/0090572 A1    Mar. 29, 2018

Related U.S. Application Data

(63) Continuation of application No. PCT/EP2016/061735, filed on May 25, 2016.

(30) Foreign Application Priority Data

May 29, 2015    (EP) ..................... 15169806

(51) Int. Cl.
   *H01L 29/10*    (2006.01)
   *H01L 29/74*    (2006.01)
   (Continued)

(52) U.S. Cl.
   CPC ........ *H01L 29/102* (2013.01); *H01L 29/0692* (2013.01); *H01L 29/0839* (2013.01);
   (Continued)

(58) Field of Classification Search
   CPC . H01L 29/74; H01L 29/0839; H01L 29/0692; H01L 29/423; H01L 29/08;
   (Continued)

(56) References Cited

U.S. PATENT DOCUMENTS

| 4,529,999 | A | 7/1985 | Bender et al. |
| 6,999,290 | B1 * | 2/2006 | Takikawa ............ H01L 27/0255 361/119 |

(Continued)

FOREIGN PATENT DOCUMENTS

| EP | 0002840 A1 | 7/1979 |
| JP | S5392391 U | 7/1978 |

(Continued)

OTHER PUBLICATIONS

European Patent Office, International Search Report & Written Opinion issued in corresponding Application No. PCT/EP2016/061735, dated Jul. 6, 2016, 12 pp.

(Continued)

*Primary Examiner* — Thanh T Nguyen
(74) *Attorney, Agent, or Firm* — J. Bruce Schelkopf; Taft Stettinus & Hollister LLP (57) ABSTRACT

There is provided a thyristor having emitter shorts, wherein in an orthogonal projection onto a plane parallel to a first main side, a contact area covered by an electrical contact of a first electrode layer with a first emitter layer and the emitter shorts includes areas in the shape of lanes, in which an area coverage of the emitter shorts is less than the area coverage of emitter shorts in the remaining area of the contact area, wherein the area coverage of the emitter shorts in a specific area is the area covered by the emitter shorts in that specific area relative to the specific area. The thyristor of the invention exhibits a fast turn-on process even without complicated amplifying gate structure.

21 Claims, 8 Drawing Sheets

(51) Int. Cl.
  *H01L 29/06* (2006.01)
  *H01L 29/08* (2006.01)
  *H01L 29/423* (2006.01)
(52) U.S. Cl.
  CPC ........ *H01L 29/42308* (2013.01); *H01L 29/74* (2013.01); *H01L 29/7404* (2013.01); *H01L 29/7428* (2013.01); *H01L 29/7432* (2013.01)
(58) Field of Classification Search
  CPC ....... H01L 29/10; H01L 29/06; H01L 29/102; H01L 29/7428; H01L 29/7404; H01L 29/7432; H01L 29/42308
  See application file for complete search history.

(56) References Cited

U.S. PATENT DOCUMENTS

| | | | | |
|---|---|---|---|---|
| 2006/0125055 A1* | 6/2006 | Menard | ............... | H01L 29/7404 257/607 |
| 2009/0230500 A1* | 9/2009 | Yoshikawa | ......... | H01L 27/0255 257/470 |
| 2011/0110068 A1* | 5/2011 | Hanaoka | ............. | H01L 29/7395 361/820 |
| 2013/0105857 A1* | 5/2013 | Streit | .................. | H01L 29/0839 257/157 |
| 2014/0240027 A1* | 8/2014 | Blanchard | ........... | H01L 29/1095 327/382 |
| 2015/0349104 A1* | 12/2015 | Rodov | ................ | H01L 29/7455 257/133 |

FOREIGN PATENT DOCUMENTS

| | | |
|---|---|---|
| JP | S5446488 A | 4/1979 |
| JP | S5618465 A | 2/1981 |
| JP | S58222571 A | 12/1983 |
| WO | 2011161097 A2 | 12/2011 |

OTHER PUBLICATIONS

European Patent Office, Extended Search Report issued in corresponding Application No. 15169806.5, dated Nov. 18, 2015, 10 pp.

\* cited by examiner

THYRISTOR WITH IMPROVED PLASMA SPREADING

FIELD OF THE INVENTION

The present invention relates to a thyristor according to the preamble of claim 1.

BACKGROUND OF THE INVENTION

A thyristor, sometimes also referred to as silicon controlled rectifier (SCR), is a switching device which can be turned on in a forward direction, i.e. when being forward biased, by supplying a positive gate trigger current pulse to a gate terminal. The thyristor is then said to be in a forward conducting state or on-state in which a current can flow in a forward direction from an anode to a cathode. On the other hand, the thyristor can also be in a forward blocking state, also referred to as off-state, meaning that a high positive voltage in the forward direction can be blocked. In a reverse direction opposite to the forward direction, the thyristor cannot be turned on. A thyristor may be reverse blocking, which means that it can block at least approximately the same voltage in the reverse direction as in the forward blocking state, or asymmetric, which means that it has virtually no blocking capability in the reverse direction. Since phase control applications commonly require reverse blocking capabilities, a phase control thyristor (PCT) is typically reverse blocking.

Figure 1:
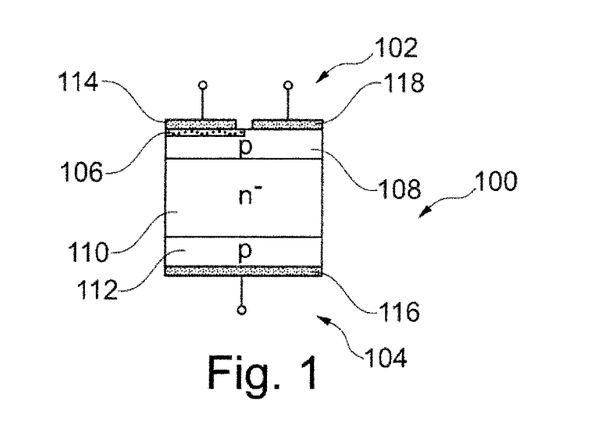
FIG. 1 is a vertical cross section of a thyristor in cross section.

In FIG. 1 there is schematically shown a cross-section of a known thyristor 100. The thyristor comprises a semiconductor wafer, in which a thyristor structure comprising four semiconductor layers having alternating conductivity types, i.e. an n-p-n-p layer stack structure is formed. In an order from a cathode side 102 to an anode side 104 of the thyristor 100, the thyristor structure comprises an $n^+$-doped cathode emitter layer 106, a p-doped base layer 108, an $n^-$-doped base layer 110, and a p-doped anode layer 112. The $n^+$-doped cathode emitter layer 106 is electrically contacted by a cathode metallization 114 formed on a cathode side surface of the semiconductor wafer to adjoin said $n^+$-doped cathode emitter layer 106. The p-doped anode layer 112 is electrically contacted by an anode metallization 116 formed on an anode side surface of the semiconductor wafer to adjoin said p-doped anode layer 112. The p-doped base layer 108 is electrically contacted by a gate metallization 118 formed on the cathode side surface of the semiconductor wafer to adjoin said p-doped base layer 108.

A contact region between the $n^+$-doped cathode emitter layer 106 and the cathode metallization 114 will be referred to as a cathode region, and a contact region between the p-doped base layer 108 and the gate metallization 118 will be referred to as a gate region.

When a positive voltage or forward voltage below the breakdown voltage VBO of the thyristor is applied between the anode metallization 116 and the cathode metallization 114, the thyristor 100 may be switched between the forward blocking state and the forward conducting state by supplying a gate trigger current pulse to the gate metallization 118. As long as no gate trigger current pulse is supplied to the gate metallization 118 the thyristor will remain in the blocking state. However, when the thyristor 100 is triggered by supplying a gate trigger current pulse to the gate 118, electrons will be injected from the cathode metallization 114, flow to the anode where they will lead to hole injection, and an electron-hole plasma will form in the p-doped base layer 108 and $n^-$-doped base layer 110 which may switch the thyristor 100 into the forward conducting state. The forward conducting state may be maintained as long as the forward voltage is applied and will be stopped when the forward voltage applied between anode metallization 116 and cathode metallization 114 is switched off or changed to a reverse voltage. Upon applying a reverse, negative voltage between the anode metallization 116 and the cathode metallization 114, the thyristor 100 goes into a reverse blocking state and may be switched to the forward conducting state by again applying a forward voltage and another gate trigger current pulse. To obtain a full blocking state of the thyristor 100, the reverse voltage has to be applied for a certain duration called quiescence time tq such that the electron-hole plasma previously injected may disappear due to recombination processes, thereby re-enabling the forward blocking capacity of the device.

Figure 2:
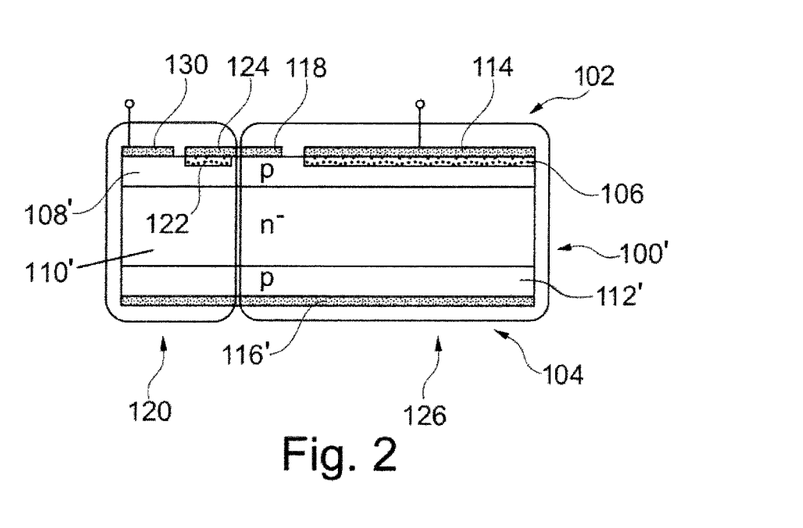
FIG. 2 is a vertical cross section of a thyristor comprising an auxiliary thyristor and a main thyristor.

To trigger thyristor 100 shown in FIG. 1, a substantial gate current is required. A known measure to facilitate triggering of a thyristor is the integration of an auxiliary thyristor 120 together with a main thyristor 126 as in the thyristor 100' shown in FIG. 2. The auxiliary thyristor 120 is also often referred to as pilot thyristor. An anode metallization 116', p-doped anode layer 112', an $n^-$-doped base layer 110' and a p-doped base layer 108' of the thyristor 100' are all shared by the auxiliary thyristor 120 and the main thyristor 126 as shown in FIG. 2. The auxiliary thyristor 120 comprises a gate metallization referred to as auxiliary gate metallization 130, which contacts the p-doped base layer 108' in the region of the auxiliary thyristor 120. The auxiliary thyristor 120 also comprises an $n^+$-doped emitter layer referred to as auxiliary $n^+$-doped emitter layer 122. The auxiliary $n^+$-doped emitter layer 122 is contacted by a cathode metallization of the auxiliary thyristor 120, which is referred to as auxiliary cathode metallization 124.

The auxiliary cathode metallization 124 is internally connected to the gate metallization of the main thyristor 126, which is referred to as main gate metallization 118. The main gate metallization 118 contacts the underlying p-doped base layer 108' in a region of the main thyristor 126. The contact region between the p-doped base layer 108' in the region of the main thyristor 126 and the main gate metallization 118 is again referred to as gate region. Preferably, a single, contiguous metallization serves as both, as the auxiliary cathode metallization 124 and as the main gate metallization 118. An $n^+$-doped emitter layer 106 is comprised in the main thyristor 126 and is contacted by the cathode metallization 114 of the main thyristor 126, wherein a contact region between the $n^+$-doped emitter layer 106 and the cathode metallization 114 in the region of the main thyristor 126 is again referred to as cathode region. Typically, the auxiliary cathode metallization 124 is not accessible from outside of the thyristor 100', i.e. no terminal exists which would allow for a direct electric connection from the outside to the auxiliary cathode metallization 124.

Small area devices can be triggered properly by a relative moderate current applied to a small gate region in the center of the device. For large-area devices of similar gate design, a significantly higher current would be required. To improve the turn-on behavior of large area devices it is known from WO 2011/161097 A2 to distribute the auxiliary thyristor structure over the whole thyristor area, thus accelerating the spread conducting region during turn-on. This reduces turn-on losses and allows higher di/dt ratings as compared to simple central-gate structures.

For high power applications, thyristors have been developed based on circular semiconductor wafers having a diameter of e.g. 4 or 5 inches. However, advanced thyristor applications require even larger thyristor designs based e.g. on 6 inch wafers. It has been observed that for such large thyristor designs, it may not be sufficient to simply scale-up previous smaller thyristor designs. With increasing thyristor diameter, further effects may gain influence on thyristor operation. For example, a larger thyristor for higher nominal current with equivalent forward blocking capacity or turn-on characteristics as well as cooling characteristics during thyristor operation may not simply be achieved by proportionally scaling thyristor dimensions.

Figure 3:
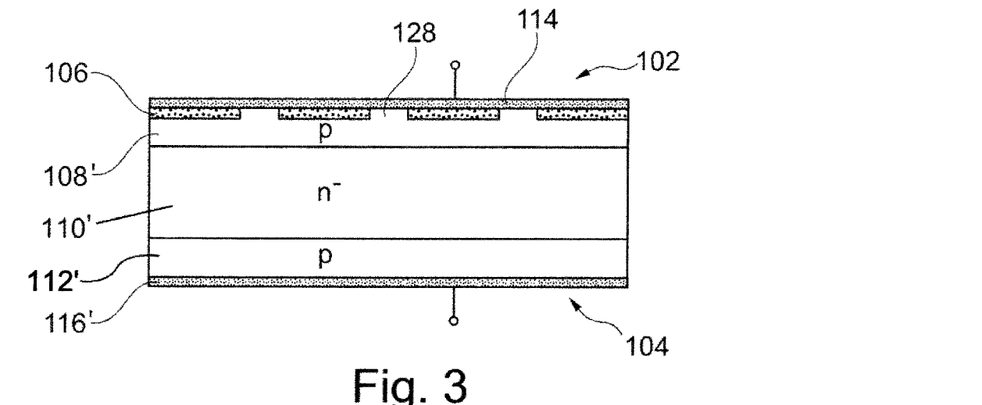
FIG. 3 is a partial vertical cross section of the thyristor shown in FIG. 2.

A thyristor 100' as described above with a homogeneously n$^+$-doped cathode emitter layer 106 as shown in FIG. 2 may be very sensitive to transients with positive voltage variations dV/dt, which may give rise to so called dynamic voltage triggering, which is caused by a charging current occurring during build-up of a depletion layer in n$^-$-doped base layer 110', which thus forms a drift region. Said charging current is amplified in a partial transistor formed by the emitter, base and drift layers of the thyristor 100'. Without impeding the forward characteristics significantly, this disadvantage may be mitigated by distributing a plurality of discrete emitter shorts 128 across the cathode region. The main purpose of the emitter shorts 128 is to allow for removal of a leakage current which occurs during the forward blocking state of the thyristor 100', and which may lead to unintentional turning on of the thyristor. The emitter shorts 128 are formed by small through holes or vias in the cathode emitter layer 106 through which the p-doped base layer 108 may reach the cathode side surface 102 metallized with the cathode metallization 114 as shown in FIG. 3. The p-doped regions with missing n$^+$-doping on the cathode side 102 thus formed are sometimes also referred to as cathode emitter shorts or cathode shorts as they may short-circuit the cathode junction. The emitter shorts 128 may form an ohmic short-circuit across a junction between p-doped base layer 108' and n$^+$-doped cathode emitter layer 106, and may conduct a significant portion of the current at low current densities, i.e. in all phases where forward blocking is required.

From EP 0 002 840 A1 there is known a thyristor exhibiting improved maximum current rise rates as a result of the relocation of the ignition front from the edge of the cathode emitter zone to inner cathode emitter areas. This relocation is effected by providing a relatively light doping of the anode zone beneath the thyristor gate and cathode emitter edge, and a relatively higher anode zone doping opposite and outside of the cathode edge, while not applying an anode electrode metal coating to the lightly doped area of the anode zone. The thyristor utilizes cathode emitter short circuit rings arranged such that the ignition front which occurs at thyristor triggering bypasses the short circuit ring immediately adjacent the cathode emitter edge, thereby increasing the thyristor voltage rise velocity, dU/dt.

From JP S53 92391 U and from JP S54 46488 A there is respectively known a thyristor device with emitter shorts, wherein no emitter shorts are provided in longitudinal areas extending in a direction away from a gate contact.

From JP S54 46488 A there is known thyristor device comprising emitter shorts, wherein the emitter shorts are arranged around the gate contact at a smaller pitch than in the remaining emitter contact area.

Figure 4:
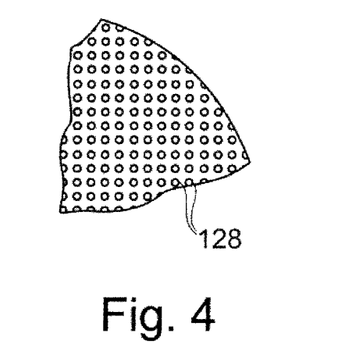
FIG. 4 illustrates the pattern of emitter shorts of the thyristor shown in FIGS. 2 and 3 in top view.

According to WO 2011/161097 A2 an emitter shorts pattern of a thyristor should be as uniform and homogenous as possible, ideally with a constant density of shorts, as shown in FIG. 4 in a partial top view, over the whole cathode region, and all subregions thereof, in particular in cathode regions close to the gate structure to achieve a high lateral plasma spread velocity and a high maximum current change dI/dt.

The shorting pattern controls the spread of plasma in lateral direction. The quality of shorting pattern design reflects in the relevant dynamic parameters like critical rate of rise of forward voltage dV$_{DM}$/dt and critical rate of rise of reverse voltage dV$_{RM}$/dt, circuit commutated recovery time t$_q$, etc. It also impacts static parameters like gate non-trigger current I$_{GD}$, gate trigger current I$_{GT}$, on-state voltage V$_T$, etc. It also strongly affects the overall reliability of a thyristor.

SUMMARY OF THE INVENTION

It is the object of the invention to provide a thyristor having a pattern of emitter shorts with improved static and dynamic parameters.

The object of the invention is attained by a thyristor according to claim 1.

The thyristor of the invention comprises a plurality of discrete emitter shorts, wherein in an orthogonal projection onto a plane parallel to the first main side, a contact area covered by an electrical contact of the first electrode layer with the first emitter layer and the emitter shorts includes areas in the shape of lanes in which an area coverage of the emitter shorts is less than the area coverage of emitter shorts in the remaining area of the contact area, wherein the area coverage of the emitter shorts in a specific area is the area covered by the emitter shorts in that specific area relative to the specific area.

In the thyristor of the invention the plasma will spread during triggering of the device in the first and in the second base layer in a lateral direction from an area below the second electrode, which is a main gate electrode of the device, along the lanes without obstruction and will turn on locally the device, speeding up the ignition process in a similar way to a complex amplifying gate. Therein, a lateral direction is a direction parallel to the first main side.

In the thyristor of the invention the lanes are curved. As a result the ignition process can be further speeded up in large area devices by decreasing the distance of points in the first emitter layer from the lanes compared to a geometry in which the lanes are straight.

Further developments of the invention are specified in the dependent claims.

In an exemplary embodiment, the lanes extend, in the orthogonal projection onto the plane parallel to the first main side, from an edge of the contact area adjacent to the second electrode layer in a direction away from the second electrode layer. In this embodiment, spreading of the plasma in a lateral direction away from the second electrode is facilitated.

In an exemplary embodiment the lanes bifurcate into two or more sub lanes. The sub lanes itself may also bifurcate into other sub lanes. With such bifurcation structure it is possible to decrease the maximum distance of points in the first emitter layer from the lanes (including the sub lanes). Accordingly, spreading of plasma into the whole device area is further facilitated.

In an exemplary embodiment the lanes have, in the orthogonal projection onto the plane parallel to the first main side, a tapered shape, so that the width of the lanes is decreasing with increasing distance from the center of the semiconductor wafer. In such exemplary embodiment the initial phase of the ignition process is speed up more than the later phase of the ignition process. The initial phase of the ignition process is most critical with regard to the dynamic parameters of the thyristor.

BRIEF DESCRIPTION OF THE DRAWINGS

Detailed embodiments of the invention and comparative examples, which do as such not form part of the claimed invention but serve for a better understanding thereof, will be explained below with reference to the accompanying figures, in which:

The reference signs used in the figures and their meanings are summarized in the list of reference signs. Generally, similar elements have the same reference signs throughout the specification. The described embodiments and comparative examples are meant as examples and shall not limit the scope of the invention.

DETAILED DESCRIPTION OF PREFERRED EMBODIMENTS AND COMPARATIVE EXAMPLES

Figure 5:
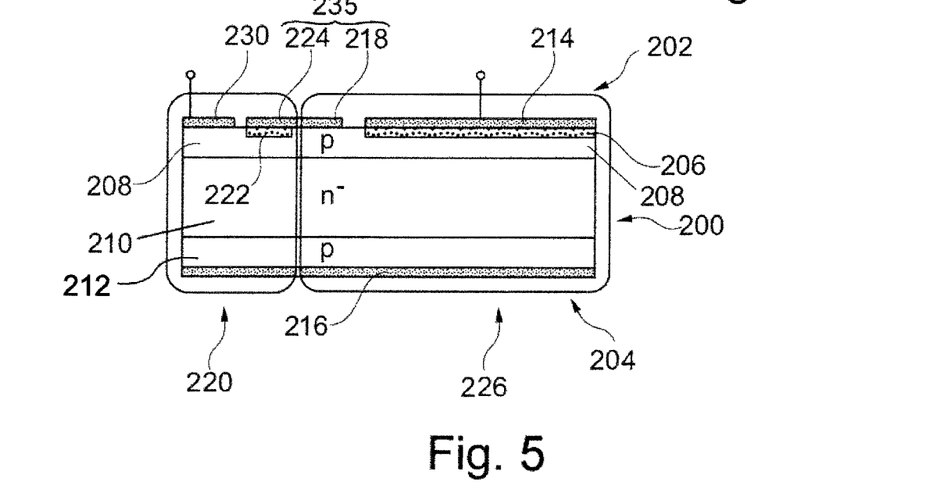
FIG. 5 is a vertical cross section of a thyristor according to a first comparative example.

In FIG. 5 there is shown a vertical cross-section of a thyristor 200 according to a first comparative example. The thyristor 200 comprises a semiconductor wafer having a first main side 202 and a second main side 204 opposite and parallel to the first main side 202. The plane of the drawing is a plane perpendicular to the first main side 202. A main thyristor 226 comprising four semiconductor layers having alternating conductivity types, i.e. an n-p-n-p layer stack structure is formed in the semiconductor wafer. In an order from the first main side 202 of the semiconductor wafer, which is a cathode side of the thyristor 200, to the second main side 204 of the semiconductor wafer, which is an anode side of the thyristor 200, the main thyristor 226 comprises a first $n^+$-doped cathode emitter layer 206, a main thyristor portion of a p-doped base layer 208, a main thyristor portion of an $n^-$-doped base layer 210, and a main thyristor portion of a p-doped anode layer 212. The first $n^+$-doped cathode emitter layer 206 is electrically contacted by a first cathode metallization 214 formed on the first main side 202 of the semiconductor wafer to form an ohmic contact with said first $n^+$-doped cathode emitter layer 206. The p-doped anode layer 212 is electrically contacted by an anode metallization 216 formed on the second main side 204 of the semiconductor wafer to form an ohmic contact with said p-doped anode layer 212 (in the regions of the main thyristor 226 and of a later described auxiliary thyristor 220). The p-doped base layer 208 is electrically contacted by a first gate metallization 218 formed on the first main side 202 of the semiconductor wafer to form an ohmic contact with the p-doped base layer 208 in the region of the main thyristor 226, i.e. with the main thyristor portion of the p-doped base layer 208.

Figure 7:
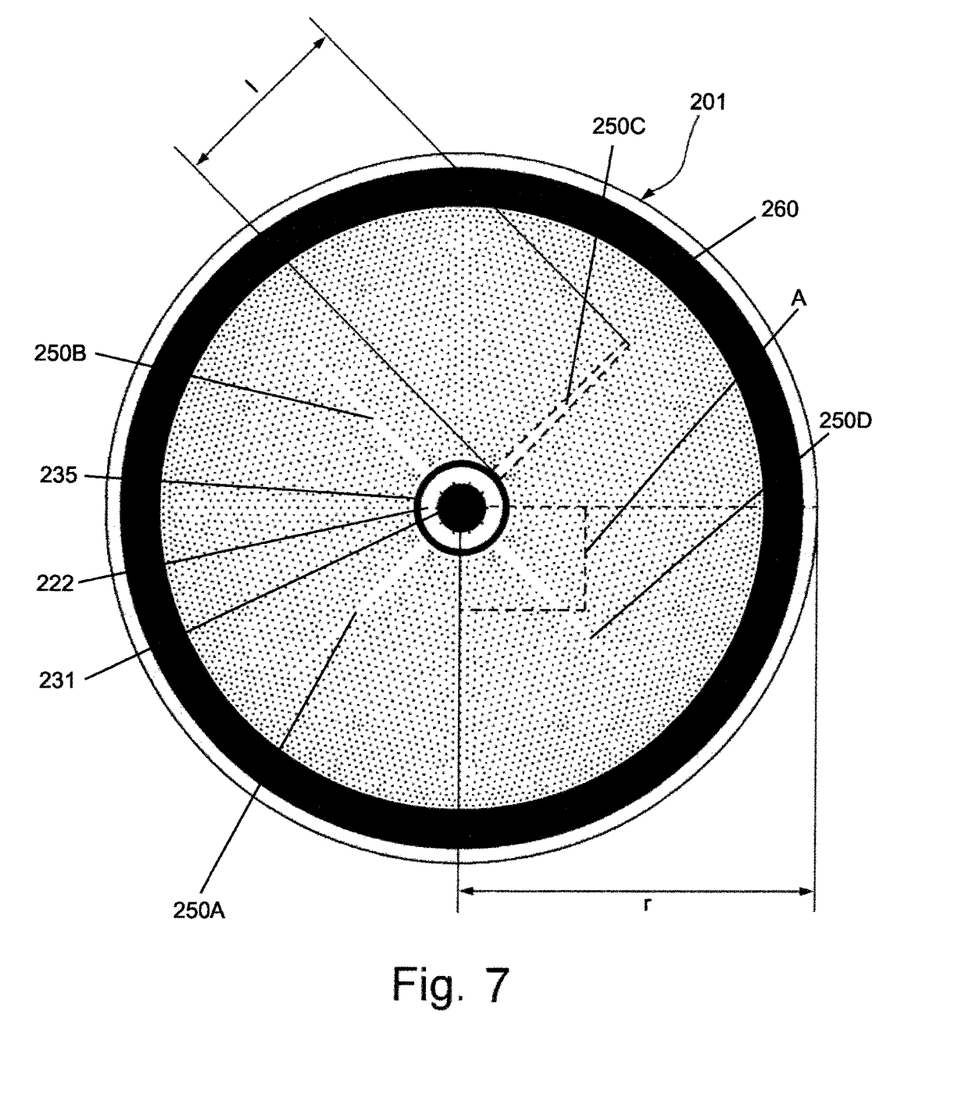
FIG. 7 is a horizontal cross section of the thyristor shown in FIG. 5.

A contact region between the first $n^+$-doped cathode emitter layer 206 and the first cathode metallization 214 will be referred to as a main cathode region, and a contact region between the p-doped base layer 208 and the first gate metallization 218 will be referred to as a main gate region 235 (shown in FIG. 7).

To facilitate triggering of the thyristor 200 as shown in FIG. 5, an auxiliary thyristor 220 is integrated together with the main thyristor 226 in the semiconductor wafer. The auxiliary thyristor 220 is also referred to as pilot thyristor and is arranged laterally next to the main thyristor 226 in the semiconductor wafer. The auxiliary thyristor 220 comprises four semiconductor layers having alternating conductivity types, i.e. an n-p-n-p layer stack structure like the main thyristor 226. In an order from the first main side 202 of the semiconductor wafer to the second main side 204 of the semiconductor wafer, the auxiliary thyristor 220 comprises a second $n^+$-doped cathode emitter layer 222, an auxiliary thyristor portion of the p-doped base layer 208, an auxiliary thyristor portion of the $n^-$-doped base layer 210, and an auxiliary thyristor portion of the p-doped anode layer 212. The second $n^+$-doped cathode emitter layer 222 is electrically contacted by a second cathode metallization 224 formed on the first main side 202 of the semiconductor wafer to form an ohmic contact with said second $n^+$-doped cathode emitter layer 222. In the region of the auxiliary thyristor 220, the p-doped base layer 208 is electrically contacted by a second gate metallization 230 formed on the first main side 202 of the semiconductor wafer to form an ohmic contact with said p-doped base layer 208.

A contact region between the second $n^+$-doped cathode emitter layer 222 and the second cathode metallization 224 will be referred to as an auxiliary cathode region, and a contact region between the p-doped base layer 208 and the second gate metallization 230 will be referred to as an auxiliary gate region 231 (shown in FIG. 7).

As follows from the above, the p-doped base layer 208 is a continuous layer shared by the main thyristor 226 and the auxiliary thyristor 220. The main thyristor portion of the p-doped base layer 208 is a portion of this continuous p-doped base layer 208 which is located in the region of the main thyristor 226, while the auxiliary thyristor portion of the p-doped base layer 208 is a portion of this continuous p-doped base layer 208 in the region of the auxiliary thyristor 226. Likewise, the $n^-$-doped base layer 210 and the p-doped anode layer 212 are continuous layers shared by the main thyristor 226 and the auxiliary thyristor 220. In the main thyristor 226 the first $n^+$-doped cathode emitter layer 206 forms a p-n junction with the p-doped base layer 208 and in the auxiliary thyristor 220 the second $n^+$-doped cathode emitter layer 222 forms a p-n junction with the p-doped base layer 208. The p-doped base layer 208 forms a p-n junction with the $n^-$-doped base layer 210 in the regions of the main thyristor 226 and of the auxiliary thyristor 220. The $n^-$-doped base layer 210 forms a p-n junction with the p-doped anode layer 212 in the regions of the main thyristor 226 and of the auxiliary thyristor 220.

The second cathode metallization 224 in the region of the auxiliary thyristor 220 is internally connected to the first gate metallization 218 in the region of the main thyristor 226. A single, contiguous metallization serves as both, as the second cathode metallization 224 and as the first gate metallization 218. Typically, the second cathode metallization 224 is not accessible from outside of the thyristor 200, i.e. no terminal exists which would allow for a direct electric connection from the outside to the second cathode metallization 224 or the first gate metallization 218. The first cathode metallization 214, the first gate metallization 218, the second cathode metallization 224 and the second gate metallization 230 may all have the same thickness and may be deposited in the same process step.

Figure 6:
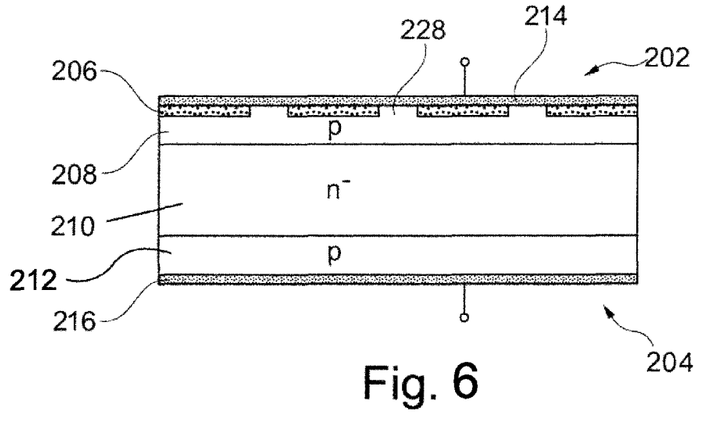
FIG. 6 is a partial vertical cross section of the thyristor shown in FIG. 5.

As can be seen in the partial vertical cross section shown in FIG. 6 a plurality of discrete emitter shorts 228 (which are not shown in FIG. 5) are formed across the main cathode region. The emitter shorts 228 are formed by p-doped regions penetrating through the first cathode emitter layer 206 to connect the first cathode metallization 214 with the p-doped base layer 208 as shown in FIG. 6. The doping level of the emitter shorts 228 may be the same as that of the p-doped base layer 208 or may be higher than that of the p-doped base layer 208.

FIG. 7 is a horizontal cross section through the semiconductor wafer 201 of the thyristor 200 adjacent to the first main side 202. The plane of the drawing is parallel to the first main side 202. Areas of the semiconductor wafer 201, which are p-type are shown in black, whereas areas which are n-type are shown in white. In the center of the semiconductor wafer 201 there is arranged a circular p-type region which is a portion of the p-doped base layer 208 corresponding to the auxiliary gate region 231. The auxiliary gate region 231 is concentric with the circular semiconductor wafer. Laterally surrounding the auxiliary gate region 231 there is arranged a ring-shaped n-type region which is the second $n^+$-doped cathode emitter layer 222 corresponding to the auxiliary cathode region. The ring-shaped second $n^+$-doped cathode emitter layer 222 is concentric with the circular semiconductor wafer 201. Surrounding the ring-shaped second $n^+$-doped cathode emitter layer 222 is arranged a ring-shaped p-type region which is a portion of the p-doped base layer 208 corresponding to the main gate region 235. In a circumferential edge region of the semiconductor wafer 201 there is formed an edge termination ring 260 which is a ring-shaped p-type region adjacent to the first main side 202 and concentric with the circular semiconductor wafer 201. Between the edge termination ring 260 and the main gate region 235 there is arranged the ring-shaped first $n^+$-doped cathode emitter layer 206 corresponding to the main cathode region. The emitter shorts 228 penetrating through the first $n^+$-doped cathode emitter layer 206 are shown as black dots in FIG. 7.

The emitter shorts 228 are distributed homogenously across the first $n^+$-doped cathode emitter layer 206 except for areas shaped as straight longitudinal lanes 250A, 250B, 250C and 250D, in which there is formed no emitter short 228.

The lanes 250A, 250B, 250C and 250D originate in the proximity of main gate region is located and extend towards the periphery of the device. Specifically, in the first comparative example the lanes extend, in the orthogonal projection onto a plane parallel to the first main side 202, from an edge of the first $n^+$-doped cathode emitter layer 206 adjacent to the main gate region 235 in a direction away from the main gate region 235. In the first comparative example the lanes 250A, 250B, 250C and 250D have all the same length l and are tapered towards their respective end adjacent to the circumferential edge of the semiconductor wafer 201. This means that the width of the lanes 250A, 250B, 250C, 250D is decreasing with increasing distance from the center of the semiconductor wafer. In the first comparative example, the lanes 250A, 250B, 250C, 250D are aligned along a radial direction of the semiconductor wafer 201 having a radius r.

Figure 8:
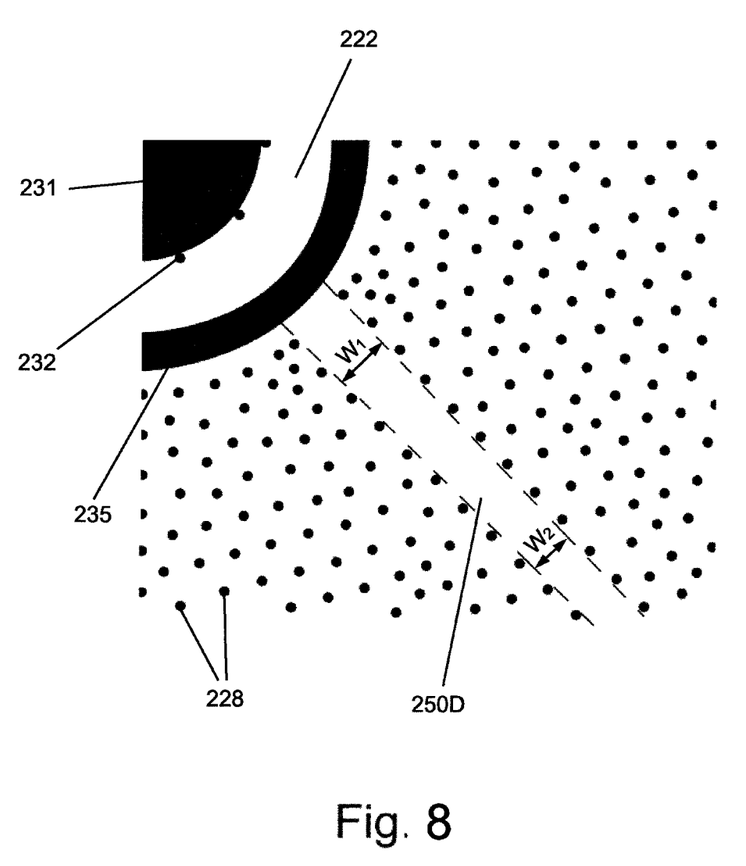
FIG. 8 is a partial view of the horizontal cross section shown in FIG. 7.

FIG. 8 is a partial view of a section A in the horizontal cross section shown in FIG. 7. In FIG. 8 there can be seen a portion of the auxiliary gate region 231. In the second $n^+$-doped cathode emitter layer 222 there are arranged a plurality of auxiliary emitter shorts 232, which are like the emitter shorts 228 p-type regions penetrating through the second $n^+$-doped cathode emitter layer 222 and connecting the p-type base layer 208 with the second cathode metallization 224. The auxiliary emitter shorts 232 are only formed in an area close to the auxiliary gate region 231. In FIG. 8 there is exemplarily indicated the width $w_1$, $w_2$ of lane 250D at two different locations. A first width $w_1$ at a first radial position is wider than the width $w_2$ at a second radial position, wherein the first radial position is closer to the ring-shaped main gate region 235 than the second radial position. This reflects the tapered shape of the lane 250D.

In an orthogonal projection onto the plane parallel to the first main side, the width of the lanes 250A, 250B, 250C, 250D is at least two times the average distance between centers of emitter shorts 228 next to each other in the main cathode region. The width of the lanes 250A, 250B, 250C, 250D may be in a range from 30 μm to 5000 μm, exemplarily in a range from 300 μm to 2000 μm.

In an exemplary embodiment the length l of the lanes 250A, 250B, 250C, 250D in a radial direction is in a range from 10% to 90% of the radius r of the semiconductor wafer 201, exemplarily in a range from 20% to 80% of the radius r of the semiconductor wafer 201.

In the orthogonal projection onto the plane parallel to the first main side 202, the emitter shorts 228 have a diameter in a range from 30 μm to 500 μm, exemplarily in a range from 50 μm to 200 μm.

In operation of the thyristor 200 the plasma formation will spread during triggering of the device in the p-doped base layer 208 and in the $n^-$-doped base layer 210 in a redial direction from regions near to the center along the lanes towards the outer periphery without obstruction and will turn on locally the device, speeding up the ignition process in a similar way to a complex amplifying gate known from WO 2011/161097 A2, for example.

The second gate metallization 230 is typically connected to a gate unit (not shown in the Figures) via a thin wire (not shown in the Figures), whereas the first cathode metallization 214 is typically contacted by pressing a molybdenum disk (not shown in the Figures) thereon. Due to the geometry of the main gate region 235, which is formed as a ring between the circular auxiliary gate region 231 and the surrounding main cathode region, the electrical separation between the molybdenum disk and the first gate metallization 218 does not require a different level of the upper surface of the first gate metallization 218 and of the upper surface of the first cathode metallization 214. The molybdenum disk may have a circular hole in its center region to avoid contact with the first gate metallization 218, the second cathode metallization 224 and the second gate metallization 230. Providing the first cathode metallization 214, the first gate metallization 218, the second cathode metallization 224 and the second gate metallization with the same thickness, so that the upper surfaces thereof are on the same level, can simplify the manufacturing process of the thyristor 200 compared to the known thyristor with a complex amplifying gate structure where the separation of the amplifying gate structure and the cathode side molybdenum disk requires providing the metallization of the main cathode with a larger thickness than that of the amplifying gate structure. Avoiding a complex amplifying gate structure in the thyristor 200 of the invention results in an increased cathode area and, therefore, in a decreased on-state voltage $V_T$.

Figure 9:
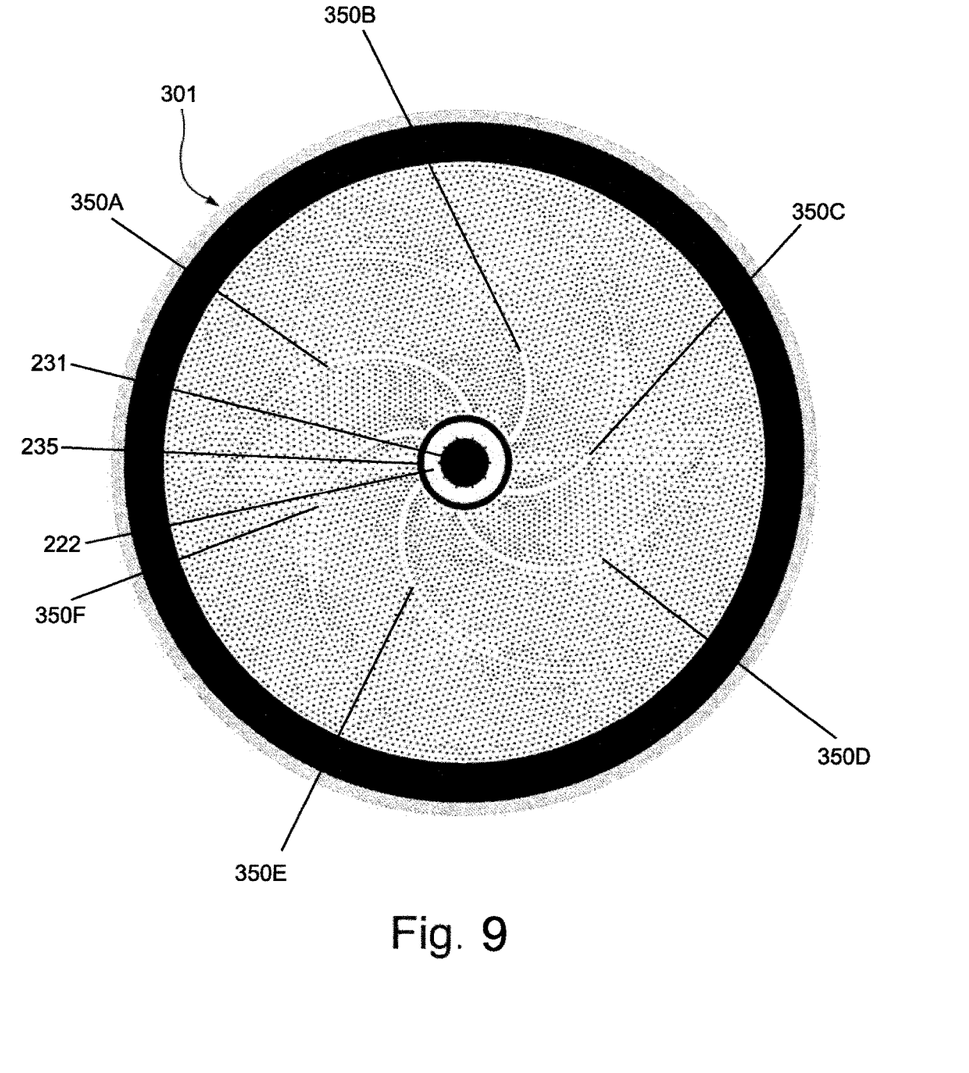
FIG. 9 is a vertical cross section of a thyristor according to a first embodiment of the invention.

Next, a thyristor according to a first embodiment of the invention will be described with reference to FIG. 9. Therein, FIG. 9 shows a horizontal cross section through the semiconductor wafer 301 adjacent to the first main side 202 of the semiconductor wafer 301. Therein, the plane of the drawing in FIG. 9 is parallel and adjacent to the first main side 202 of the semiconductor wafer 301. In the following only features of the thyristor according to the first embodiment, which differ from the features of the thyristor 200 according to the first comparative example, will be described, while features that are the same in the first comparative example and in the first embodiment will not be repeated.

Same reference signs in the Figures relate to same elements having the same features if not indicated otherwise. Therefore, it is referred to the description of the first comparative example with regard to further details regarding these features. In the main cathode region of the thyristor according to the first embodiment, there are areas in the shape of lanes 350A, 350B, 350C, 350D, 350E, 350F, in which no emitter shorts 228 are formed, as shown in FIG. 9. These lanes 350A, 350B, 350C, 350D, 350E, 350F differ from lanes 250A, 250B, 250C, 250D in the main cathode region of the thyristor 200 according to the first comparative example in that they are not straight but curved. Further, in the first embodiment, the number of lanes 350A, 350B, 350C, 350D, 350E, 350F is six, whereas the number of lanes 250A, 250B, 250C, 250D in the thyristor 200 according to the first comparative example is four. In the thyristor according to the first embodiment, the ignition process can be further speed up in large area devices by decreasing the distance of points in the first n$^+$-doped cathode emitter layer 206 from the lanes 350A, 350B, 350C, 350D, 350E, 350F compared to a geometry in which the lanes 250A, 250B, 250C, 250D are straight as in the first comparative example. Besides the curved geometry of the lanes 350A, 350B, 350C, 350D, 350E, 350F also the higher number of lanes 350A, 350B, 350C, 350D, 350E, 350F in the first embodiment results in an increased speed of the ignition process.

Figure 10:
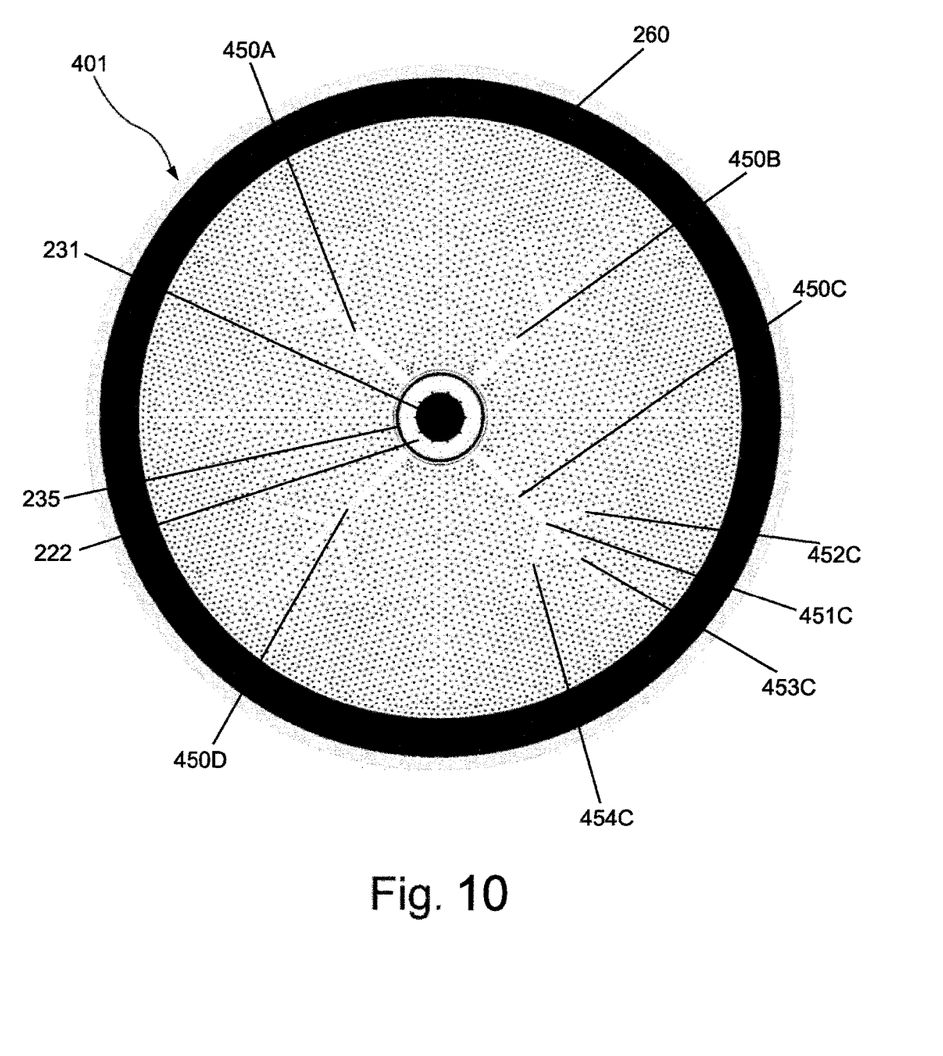
FIG. 10 is a vertical cross section of a thyristor according to a second comparative example.

Next a thyristor according to a second comparative example will be described with reference to FIG. 10. Therein, FIG. 10 shows a horizontal cross section through the semiconductor wafer 401 adjacent to the first main side 202 of the semiconductor wafer 401. Therein, the plane of the drawing in FIG. 9 is parallel and adjacent to the first main side 202 of the semiconductor wafer 301. In the following only features of the thyristor according to the second comparative example, which differ from the features of the thyristor according to the first comparative example, will be described, while features of the thyristor according to the second comparative example, which are the same as in the first comparative example, will not be repeated. Same reference signs in the Figures relate to same elements having the same features if not indicated otherwise. Therefore, it is referred to the description of the first comparative example with regard to further details regarding these features. In the thyristor according to the second comparative example shown in FIG. 10, the lanes 450A, 450B, 450C, 450D differ from the lanes 250A, 250B, 250C, 250D of the first comparative example in that they bifurcate into three sub lanes, respectively. Specifically, the lane 450C bifurcates into three sub lanes 452C, 453C, 454C at the bifurcation point 451C. With such bifurcation structure it is possible to decrease the distance of points in the first n$^+$-doped emitter layer 206 from the lanes 450A, 450B, 450C, 450D (including the sub lanes 452C, 453C, 454C). Accordingly, spreading of plasma formation into the whole device area is further facilitated. Each one of the sub lanes 452C, 453C, 454C is also tapered in direction away from the bifurcation point 451C.

Figure 11:
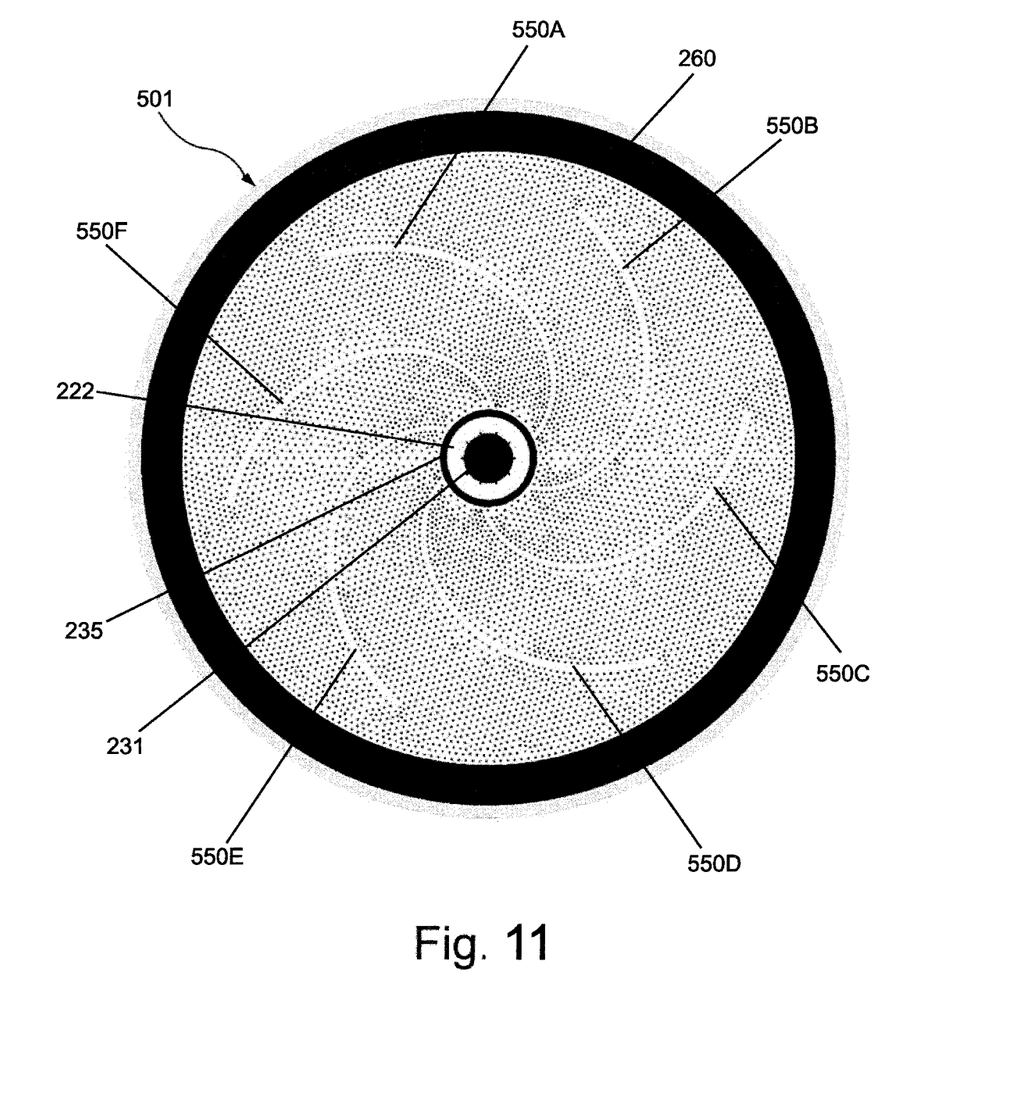
FIG. 11 is a vertical cross section of a thyristor according to a second embodiment of the invention.

Next a thyristor according to a second embodiment will be described with reference to FIG. 11. Therein, FIG. 11 shows a horizontal cross section through the semiconductor wafer 501 adjacent to the first main side 202 of the semiconductor wafer 501. Therein, the plane of the drawing in FIG. 11 is parallel and adjacent to the first main side 202 of the semiconductor wafer 501. In the following only features of the thyristor according to the second embodiment, which differ from the features of the thyristor according to the first embodiment, will be described, while features of the thyristor according to the second embodiment, which are the same as in the first embodiment, will not be repeated. Same reference signs in the Figures relate to same elements having the same features if not indicated otherwise. Therefore, it is referred to the description of the first embodiments with regard to further details regarding these features. Like the thyristor according to the first embodiment shown in FIG. 9, also the thyristor according to the second embodiment as shown in FIG. 11 has six lanes 550A, 550B, 550C, 550D, 550E, 550F. Further, these six lanes 550A to 550F have a curved shape like the six lanes 350A to 350F. However, the lanes 550A to 550F in the thyristor according to the second embodiment differ from the lanes 350A to 350F in the thyristor according to the first embodiment in that they are not tapered in a direction away from center of the semiconductor wafer 501 but are tapered in a direction towards the center of the semiconductor wafer 501. That means that the width of the lanes 350A to 350F increases with increasing distance from the center of the semiconductor wafer 501.

In the description above, specific embodiments of the invention and comparative examples were described. However, alternatives and modifications of the above described embodiments and comparative examples are possible. In particular, in the above embodiments and comparative examples, no emitter shorts 228 are formed in the lanes 250A to 250D, 350A to 350E, 450A to 450D (including sub lanes 452C, 452C, 453C), 550A to 550E, respectively. However, emitter shorts 228 may also be formed in the lanes 250A to 250D, 350A to 350E, 450A to 450D (including sub lanes 452C, 452C, 453C), 550A to 550E as long as an area coverage of the emitter shorts 228 in the lanes 250A to 250D, 350A to 350E, 450A to 450D (including sub lanes 452C, 452C, 453C), 550A to 550E is less than the area coverage of emitter shorts 228 in the remaining area of the main cathode region, wherein the area coverage of the emitter shorts 228 in a specific area is the area covered by the emitter shorts 228 in that specific area relative to the specific area.

The ignition process is fastest in an exemplary embodiment, in which, in the orthogonal projection onto the plane parallel to the first main side 202, no emitter shorts are arranged in the lanes 250A to 250D, 350A to 350E, 450A to 450D (including sub lanes 452C, 452C, 453C), 550A to 550E as in the above described embodiments and comparative examples.

Exemplarily, in an orthogonal projection onto the plane parallel to the first main side 202, a density of emitter shorts 228 in the lanes 250A to 250D, 350A to 350E, 450A to 450D (including sub lanes 452C, 452C, 453C), 550A to 550E may be less than a density of emitter shorts 228 in the remaining main cathode region outside of the lanes 250A to 250D, 350A to 350E, 450A to 450D (including sub lanes 452C, 452C, 453C), 550A to 550E, wherein the density of emitter shorts 228 in a specific area is the number of emitter shorts 228 in that specific area relative to the specific area.

In the above described embodiments and comparative examples the emitter shorts 228 have all the same diameter in a plane parallel to the first main side 202. However, it may also be possible that the emitter shorts 228 have different diameters in the plane parallel to the first main side 202.

In the above described second comparative example, the lanes 450A to 450D bifurcate into three sub lanes, for example into the sub lanes 452C, 453C, 454C, at one single bifurcation point for example 451C, respectively. However, there may be also further bifurcation points. Also the sub lanes, for example the sub lanes 452C, 453C, 454C, itself may also bifurcate into more than one other sub lane.

In the above described embodiments and comparative examples, the thyristor 200 comprises the main thyristor 226 and the auxiliary thyristor 220. However, the thyristor of the invention does not necessarily have the auxiliary thyristor 226.

In the above described embodiments and comparative examples, the semiconductor wafer was described to be circular. However, the semiconductor wafer does not necessarily have to be circular. It can also be rectangular. In case of a rectangular semiconductor wafer, the main gate region may exemplarily be located at a corner of the rectangular semiconductor wafer and the lanes may extend in directions away from the main gate region located in the corner. Any other shape of the semiconductor wafer may be used.

In the above described embodiments and comparative example, the main gate region 235 is located near the center of the semiconductor wafer 201, 301, 401, 501, and the main cathode region is laterally surrounding the main gate region 235. However, instead the main cathode region may be formed in the center of the semiconductor wafer and the main gate region may surround the main cathode region.

It should be noted that the term "comprising" does not exclude other elements or steps and that the indefinite article "a" or "an" does not exclude the plural. Also elements described in association with different embodiments and comparative examples may be combined.

LIST OF REFERENCE SIGNS 100 thyristor
100' thyristor
102 cathode side
104 anode side
106 n$^+$-doped cathode emitter layer
108 p-doped base layer
108' p-doped base layer
110 n$^-$-doped base layer
110' n$^-$-doped base layer
112 p-doped anode layer
112' p-doped anode layer
114 cathode metallization
116 anode metallization
116' anode metallization
118 gate metallization
120 auxiliary thyristor
122 auxiliary n$^+$-doped emitter layer
124 auxiliary cathode metallization
126 main thyristor
128 emitter short
130 auxiliary gate metallization
200 thyristor
201 semiconductor wafer
202 first main side
204 second main side
206 first n$^+$-doped cathode emitter layer
208 p-doped base layer
210 n$^-$-doped base layer
212 p-doped anode layer
214 first cathode metallization
216 anode metallization
218 first gate metallization
220 auxiliary thyristor
222 second n$^+$-doped cathode emitter layer
224 second cathode metallization
226 main thyristor
228 emitter short
230 second gate metallization
235 main gate region
231 auxiliary gate region
250A lane
250B lane
250C lane
250D lane
260 edge termination ring
301 semiconductor wafer
350A lane
350B lane
350C lane
350D lane
350E lane
350F lane
401 semiconductor wafer
450A lane
450B lane
450C lane
450D lane
501 semiconductor wafer
550A lane
550B lane
550C lane
550D lane
550E lane
550F lane

The invention claimed is:

1. A thyristor device comprising:
a semiconductor wafer having a first main side and a second main side opposite to the first main side;
a first electrode layer, which is arranged on the first main side;
a second electrode layer, which is arranged on the first main side and which is electrically separated from the first electrode layer;
a third electrode layer, which is arranged on the second main side;
wherein the semiconductor wafer includes the following layers;
a first emitter layer of a first conductivity type, the first emitter layer being in electrical contact with the first electrode layer;

a first base layer of a second conductivity type different from the first conductivity type, wherein the first base layer is in electrical contact with the second electrode layer, and wherein the first base layer and the first emitter layer form a first, p-n junction;

a second base layer of the first conductivity type, the second base layer and the fist base layer forming a second p-n junction;

a second emitter layer of the second conductivity type, wherein the second emitter layer is in electrical contact with the third electrode layer, and wherein the second emitter layer and the second base layer form a third p-n junction.

wherein the thyristor device comprises a plurality of discrete emitter shorts, each emitter short penetrating through the first emitter layer to electrically connect the first base layer with the first electrode layer, wherein in an orthogonal projection onto a plane parallel to the first main side, a contact area covered by an electrical contact of the first electrode layer with the first emitter layer and the emitter shorts includes areas in the shape of lanes in which no emitter shorts are arranged, wherein the width of the lanes is at least two times the average distance between centers of emitter shorts next to each other in the contact area, the lanes are curved, and in the orthogonal projection onto the plane parallel to the first main side, the lanes extend from an edge of the contact area adjacent to the second electrode layer in a direction away from the second electrode layer.

2. The thyristor device according to claim 1 wherein the lanes bifurcate into two or more sub lanes.

3. The thyristor device according to claim 2, wherein, in the orthogonal projection onto the plane parallel to the first main side, the width of the lanes is in a range from 30 μm to 5000 μm.

4. The thyristor device according to claim 3, wherein, in the orthogonal projection onto the plane parallel to the first main side, the width of the lanes is in a range from 300 μm to 2000 μm.

5. The thyristor device according to claim 2, wherein, in the orthogonal projection onto the plane parallel to the first main side, the semiconductor wafer is circular and the first electrode layer is a circular metallization layer, which is concentric with the semiconductor wafer.

6. The thyristor device according to claim 2, comprising an auxiliary thyristor structure, which includes:

an auxiliary gate electrode layer formed on the first main side in electrical contact with the first base layer, the auxiliary gate electrode layer being electrically separated from the electrode layer and the second electrode layer; and a third emitter layer of the first conductivity type, wherein the third emitter layer is separated from the first emitter layer by the first base layer, wherein the third emitter layer forms a fourth p-n junction with the first base layer, and wherein the third emitter layer is in electrical contact with the second electrode layer.

7. The thyristor device according to claim 2, wherein, in the orthogonal projection onto the plane parallel to the first main side, the emitter shorts have a diameter in a range from 30 μm to 500 μm.

8. The thyristor device according to claim 7, wherein, in the orthogonal projection onto the plane parallel to the first main side, the emitter shorts have a diameter in a range from 50 μm to 200 μm.

9. The thyristor device according to claim 1, wherein, in the orthogonal projection onto the plane parallel to the first main side, the width of the lanes is in a range from 30 μm to 5000 μm.

10. The thyristor device according to claim 9, wherein, in the orthogonal projection onto the plane parallel to the first main side, the width of the lanes is in a range from 300 μm to 2000 μm.

11. The thyristor device according to claim 9, wherein, in the orthogonal projection onto the plane parallel to the first main side, the semiconductor wafer is circular and the first electrode layer is a circular metallization layer, which is concentric with the semiconductor wafer.

12. The thyristor device according to claim 1, wherein, in the orthogonal projection onto the plane parallel to the first main side, the semiconductor wafer is circular and the first electrode layer is a circular metallization layer, which is concentric with the semiconductor wafer.

13. The thyristor device according to claim 12, wherein the extension of the lanes in a radial direction is in a range from 10% to 90% of a radius of the semiconductor wafer.

14. The thyristor device according to claim 13, wherein the extension of the lanes in a radial direction is in a range from 20% to 80% of the radius of the semiconductor wafer.

15. The thyristor device according to claim 12, wherein, in the orthogonal projection onto the plane parallel to the first main side, the lanes have a tapered shape, so that the width of the lanes is decreasing with increasing distance from the center of the semiconductor wafer.

16. The thyristor device according to claim 1, comprising an auxiliary thyristor structure, which includes:

an auxiliary gate electrode layer formed on the first main side in electrical contact with the first base layer, the auxiliary gate electrode layer being electrically separated from the first electrode layer and the second electrode layer; and a third emitter layer of the first conductivity type, wherein the third emitter layer is separated from the first emitter layer by the first base layer, wherein the third emitter layer forms a fourth p-n junction with the first base layer, and wherein the third emitter layer is in electrical contact with the second electrode layer.

17. The thyristor device according to claim 16, wherein in the orthogonal projection onto the plane parallel to the first main side, the semiconductor wafer is circular, the second electrode layer is a ring-shaped metallization layer, which is concentric with the semiconductor wafer, and the auxiliary gate electrode layer is a circular metallization layer, which is concentric with the semiconductor wafer.

18. The thyristor device according to claim 16, wherein the extension of the lanes in a radial direction is in a range from 10% to 90% of a radius of the semiconductor wafer.

19. The thyristor device according to claim 16, wherein, in the orthogonal projection onto the plane parallel to the first main side, the lanes have a tapered shape, so that the width of the lanes is decreasing with increasing distance from the center of the semiconductor wafer.

20. The thyristor device according to claim 1, wherein, in the orthogonal projection onto the plane parallel to the first main side, the emitter shorts have a diameter in a range from 30 μm to 500 μm.

21. The thyristor device according to claim 20, wherein, in the orthogonal projection onto the plane parallel to the first main side, the emitter shorts have a diameter in a range from 50 μm to 200 μm.

* * * * *